(12) United States Patent
Lee (10) Patent No.: US 6,761,526 B2
(45) Date of Patent: Jul. 13, 2004

(54) PICKING APPARATUS FOR SEMICONDUCTOR DEVICE TEST HANDLER

(75) Inventor: Sang Soo Lee, Chungchongnam-do (KR)

(73) Assignee: Mirae Corporation, Chungchongnam-do (KR)

( * ) Notice: Subject to any disclaimer, the term of this patent is extended or adjusted under 35 U.S.C. 154(b) by 21 days.

(21) Appl. No.: 10/321,674

(22) Filed: Dec. 18, 2002

(65) Prior Publication Data

US 2003/0133778 A1 Jul. 17, 2003

(30) Foreign Application Priority Data

Jan. 17, 2002 (KR) ................................ 10-2002-0002818

(51) Int. Cl.[7] ................................................ B65G 9/00
(52) U.S. Cl. ........................ 414/618; 414/626; 414/736
(58) Field of Search ................................ 414/618, 626, 414/627, 736, 737; 294/87.1; 901/40; 198/418.6, 428, 750.12, 750.11, 379, 380, 381

(56) References Cited

U.S. PATENT DOCUMENTS

| | | | | |
|---|---|---|---|---|
| 4,614,474 A | * | 9/1986 | Sudo ........................ 414/281 |
| 4,674,936 A | * | 6/1987 | Bonora ...................... 414/217 |
| 4,676,709 A | * | 6/1987 | Bonora et al. .............. 414/217 |
| 4,724,874 A | * | 2/1988 | Parikh et al. ................. 141/98 |
| 4,802,809 A | * | 2/1989 | Bonora et al. .............. 414/217 |
| 4,952,115 A | * | 8/1990 | Ohkase ....................... 414/618 |
| 5,051,054 A | * | 9/1991 | Wagner et al. .............. 414/618 |
| 5,870,990 A | * | 2/1999 | Sczepanski ................. 414/543 |

* cited by examiner

Primary Examiner—Christopher P. Ellis
Assistant Examiner—Rashmi Sharma
(74) Attorney, Agent, or Firm—Fleshner &Kim, LLP (57) ABSTRACT

There is provided a picking apparatus for transferring semiconductor devices in a test handler to increase the number of devices transferred at one time and suitable for devices having different pitches. The apparatus includes: a moving block movably installed on the frame; a first vertical block and a second vertical block installed on both sides of the moving block in a vertical direction to face each other; at least one pair of first guide members and at least one pair of second guide members installed at each of the first vertical block and the second vertical block in the vertical direction; a first lifting block and a second lifting block each of which both ends are respectively coupled to the first guide members and the second guide members to move up and down; a first picker block and a second picker block having a plurality of pickers for picking and detaching the semiconductor devices, and detachably coupled with the first lifting block and the second lifting block; and driving means for driving the first picker block and the second picker block to move up and down in the opposite directions to each other.

8 Claims, 7 Drawing Sheets

PICKING APPARATUS FOR SEMICONDUCTOR DEVICE TEST HANDLER

This application claims the benefit of the Korean Application No. P2002-2818 filed on Jan. 17, 2002, which is hereby incorporated by reference.

BACKGROUND OF THE INVENTION

1. Field of the Invention

The present invention relates to an apparatus for picking and transferring semiconductor devices in a test handler, and more particularly, to a picking apparatus for a test handler of semiconductor devices, in which pickers for picking up semiconductor devices are installed in two arrays in one picking apparatus to move them in the up and down directions opposite to each other, so that semiconductor devices as many as two times can be transferred by once transferring process and the semiconductor devices can be transferred at a different pitch.

2. Discussion of the Related Art

As widely known, memory or non-memory semiconductor devices, or modules in which these semiconductor devices are integrated on a single substrate in a circuit design, are produced out after various kinds of test processing. The handler indicates an apparatus for automatically transferring the aforementioned semiconductor devices, modules or the like to a desired process for test.

Generally, the handler transfers semiconductor devices accommodated in a tray to or from a flat-typed shuttle or a buffer-plate. For this purpose, the handler is provided on the upper side of a body thereof with a transferring (or picking) apparatus. The transferring device is linearly moved in X direction or Y direction, and picks up and transfers semiconductor devices to a specific location.

Figure 1:
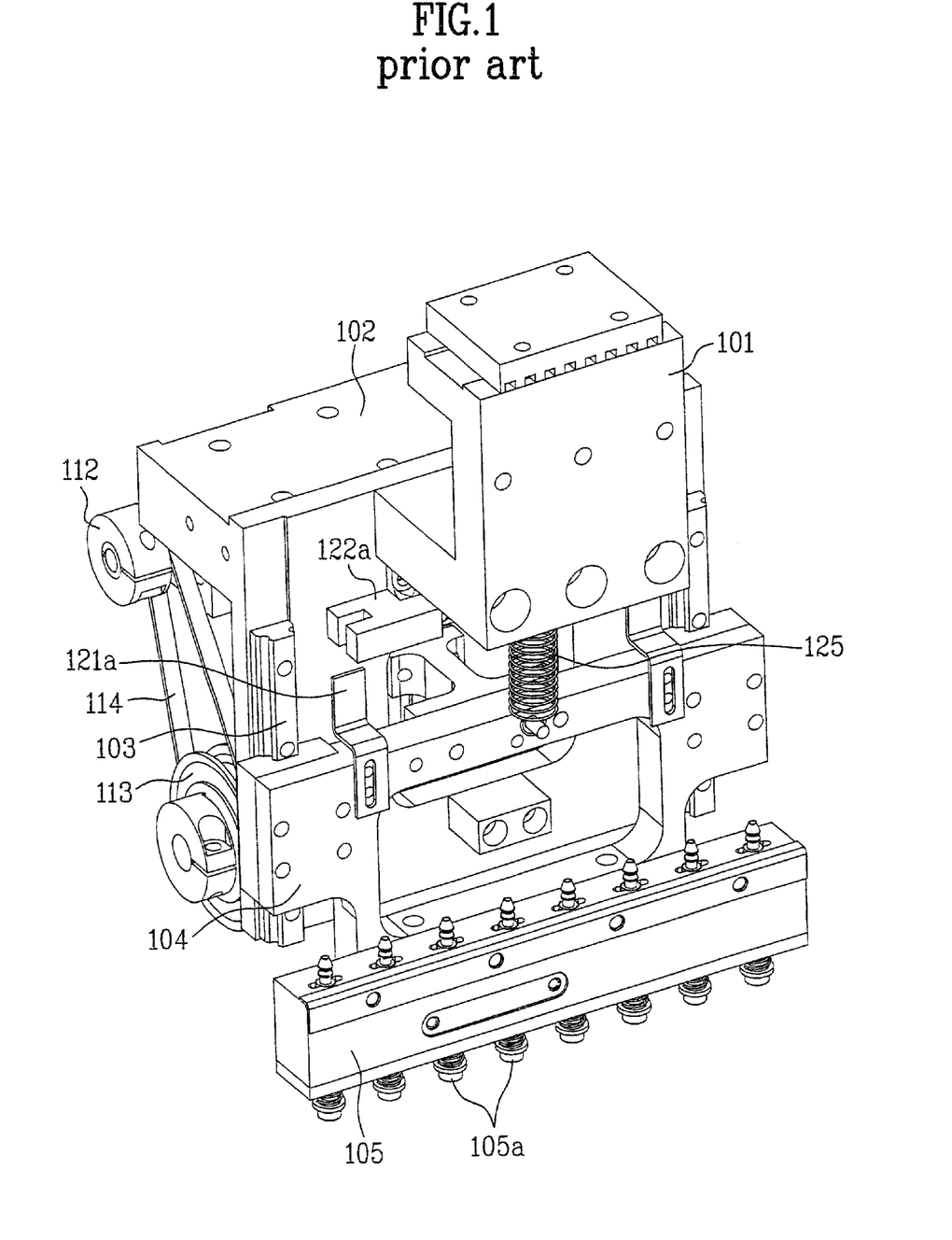
FIG. 1 is a front perspective view of a conventional picking apparatus for semiconductor devices.
Figure 2:
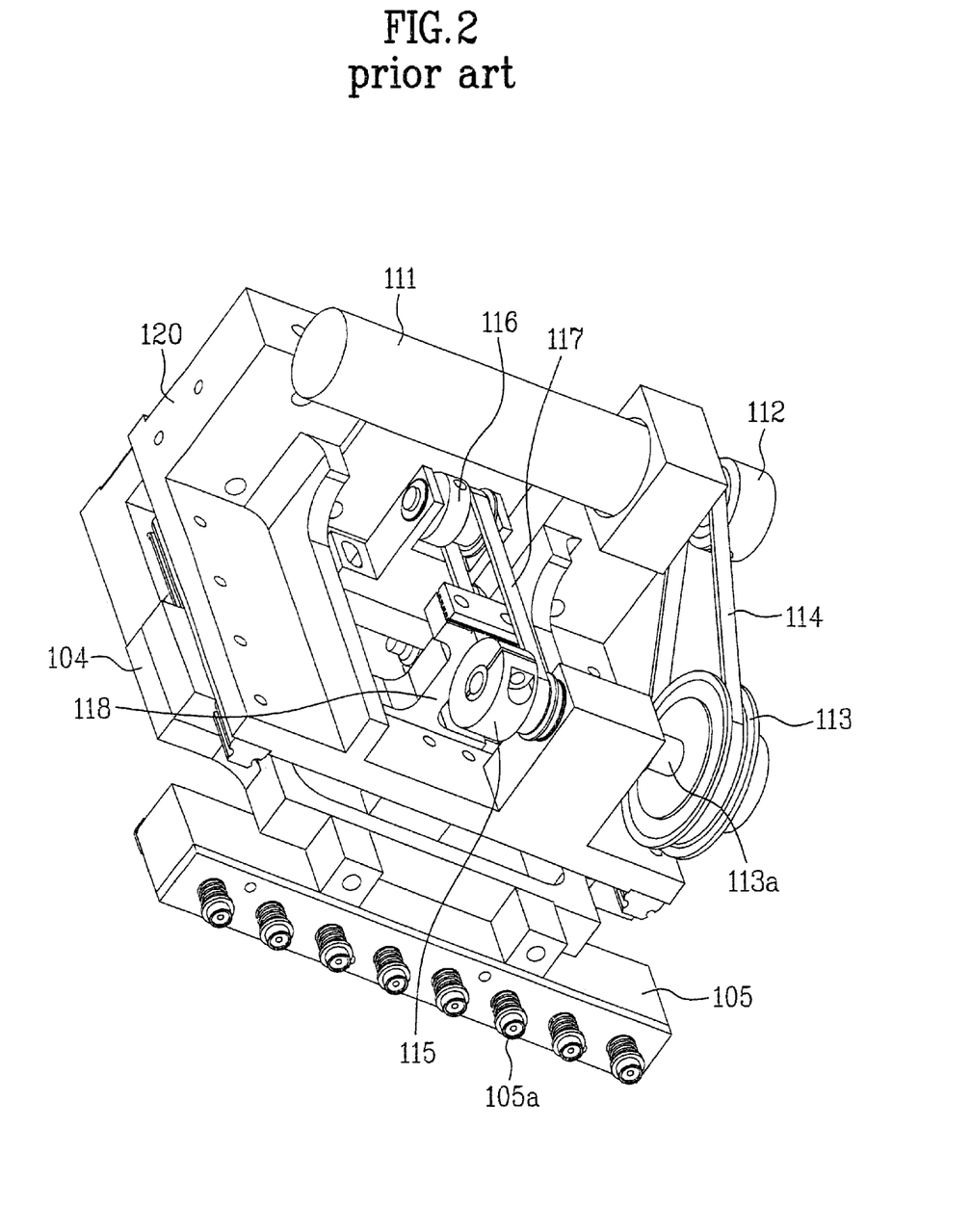
FIG. 2 is a rear perspective view of the picking apparatus of FIG. 1.
Figure 3:
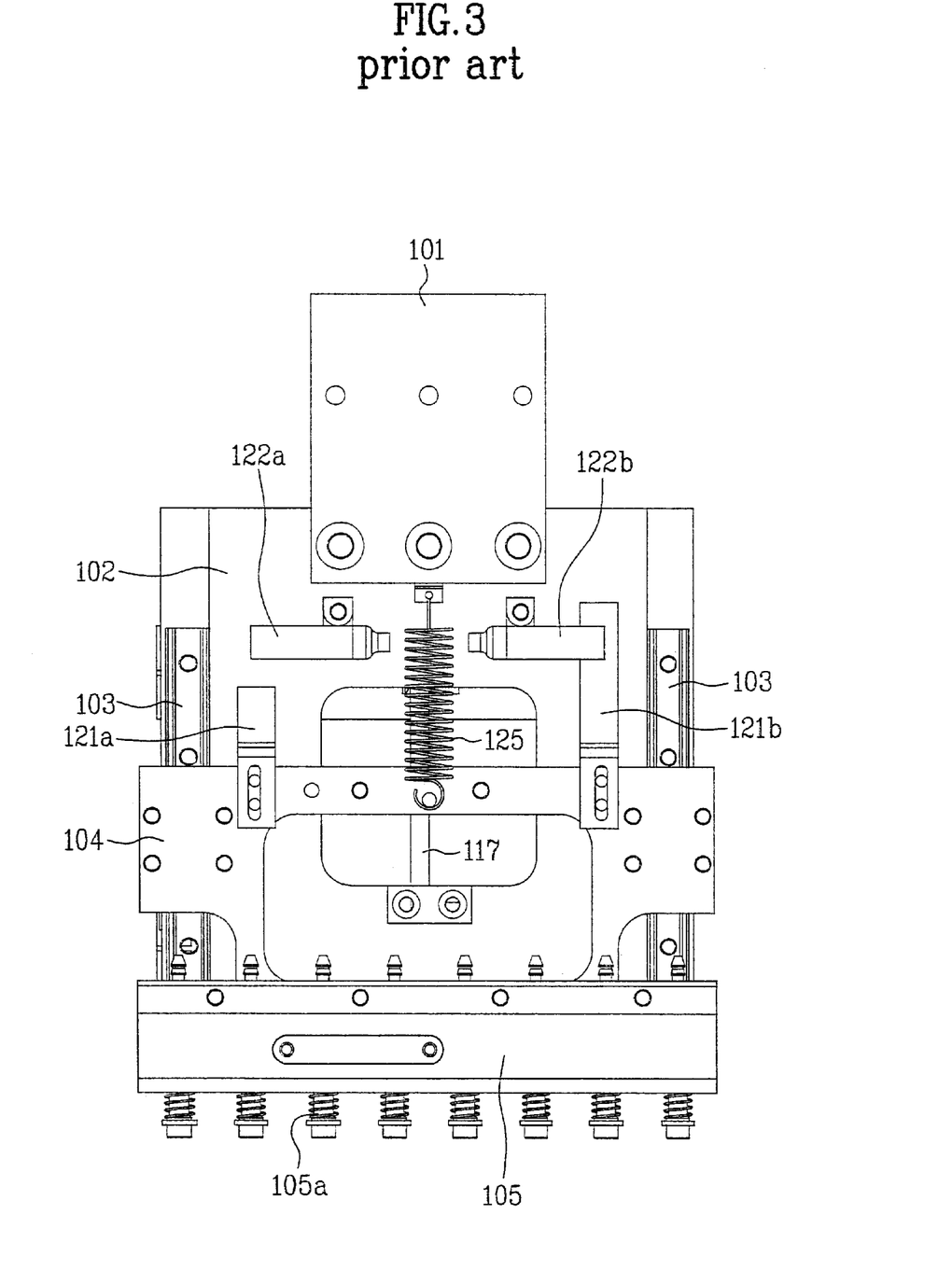
FIG. 3 is a front view of the picking apparatus of FIG. 1.
Figure 4:
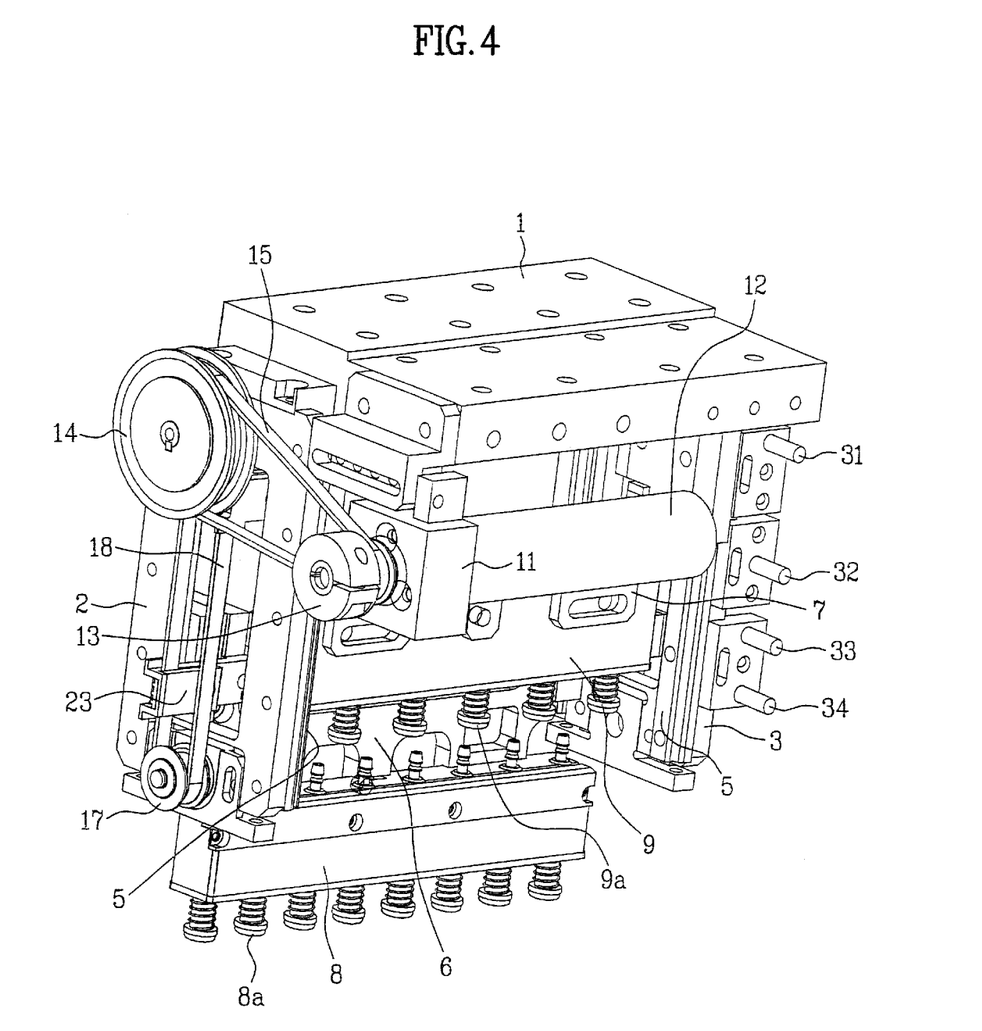
FIG. 4 is a perspective rear view of a picking apparatus for semiconductor devices according to the present invention.
Figure 5:
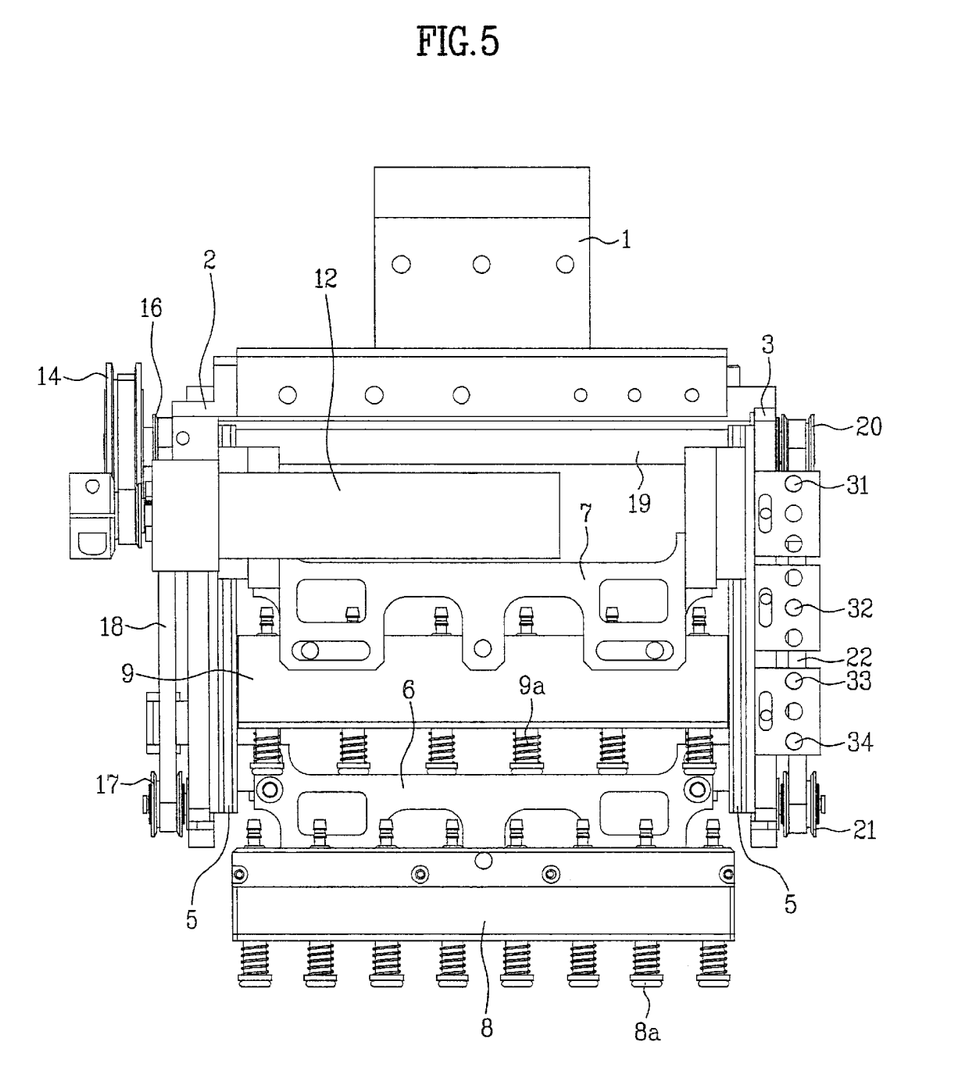
FIG. 5 is a rear view of the picking apparatus of FIG. 4.
Figure 6:
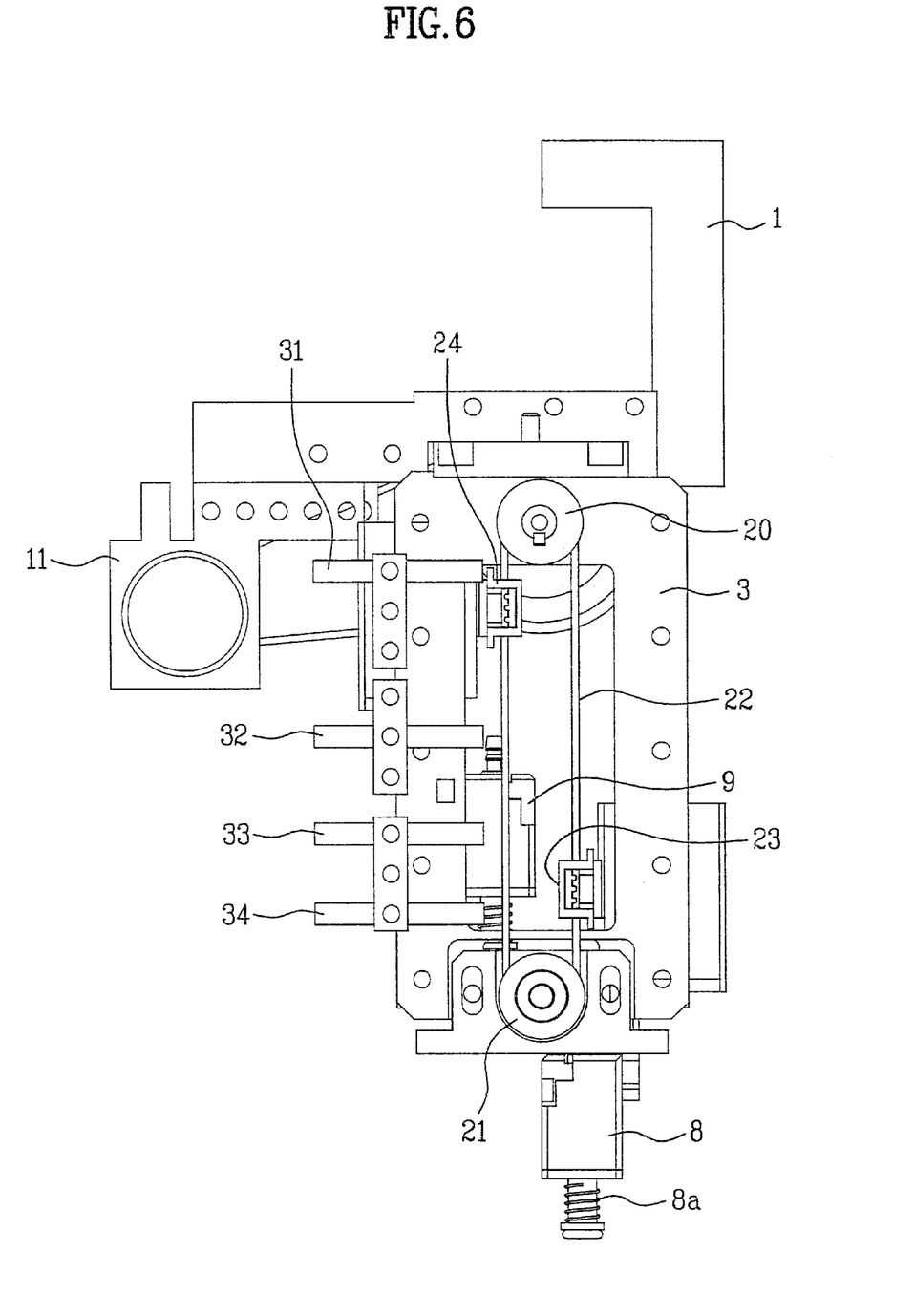
FIG. 6 is a side view of the picking apparatus of FIG. 4.
Figure 7:
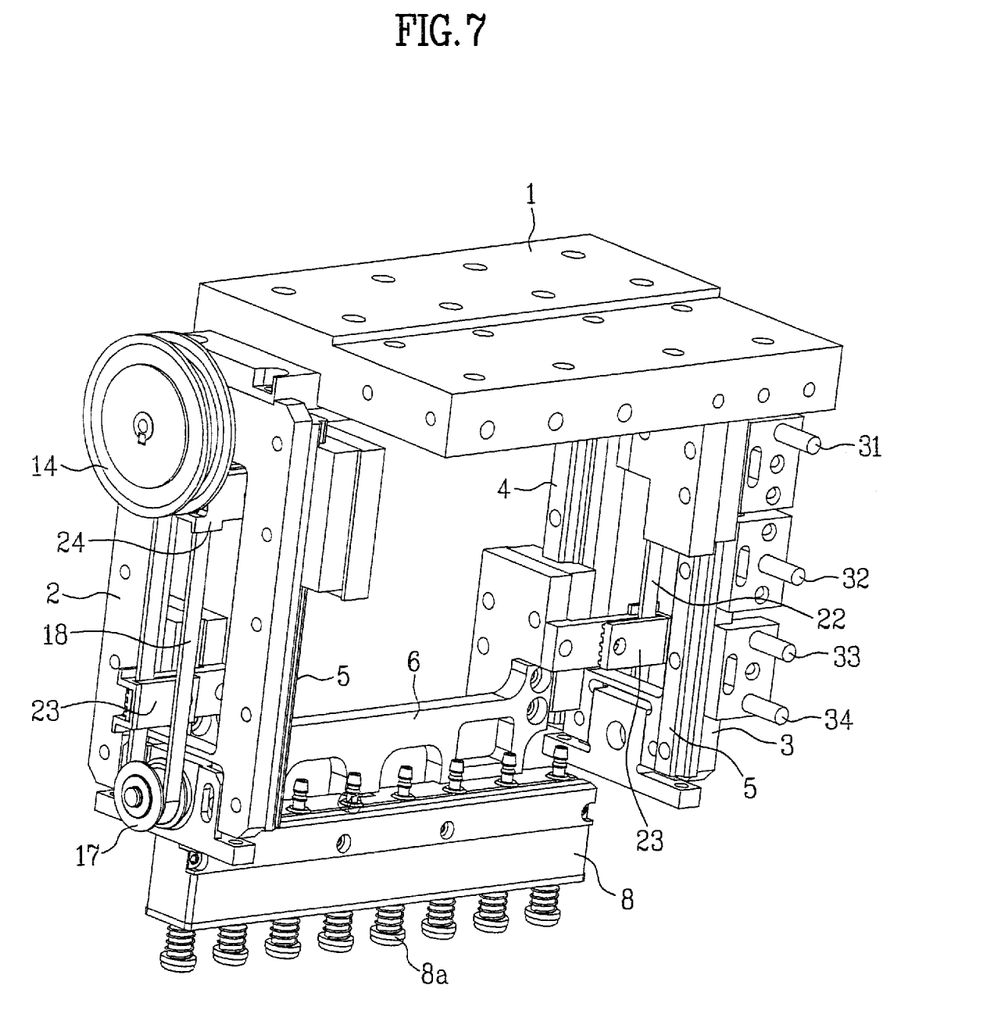
FIG. 7 is a perspective view of the picking apparatus of FIG. 4, some parts of which are removed to show its structure more clearly.

FIGS. 1 to 3 illustrate one example of a conventional picking apparatus for transferring semiconductor devices in the handler.

As shown in FIGS. 1 to 3, the conventional picking apparatus for transferring semiconductor devices includes a moving block 101 installed to move along a frame (not shown) horizontally installed on the handler, a vertical block 102 fixedly coupled with the moving block 101, a lifting block 104 fixedly installed to LM Guides 103 which are installed on the both sides of the vertical block 102 in up and down directions, to move up and down, and a picker block 105 coupled with the lifting block 104 and having a plurality of nozzle pickers 105a for adsorbing semiconductor devices by vacuum pressure.

Also, on the rear side of the vertical block 102 is installed a driving means for lifting the lifting block 104. Specifically, a servomotor 111 and a driving pulley 112 driver by the servomotor 111 are installed on the rear upper side of the vertical block 102. On the lower side of the vertical block 102 is installed a transmission pulley 113 which rotate with coupled with the driving pulley 112 by a driving belt 114. At one end of a rotation axis 113a of the driving pulley 113A is installed a lower pulley 115 which rotates by the rotation of the transmission pulley 113. The lower pulley 115 is coupled with an upper pulley 116 by a lifting belt 117.

Also, at one side of the lifting belt 117 is fixedly installed a connecting piece 118 fixed with the lifting block 104.

In the meantime, on the front side of the vertical block 102 is coupled an extension spring 125 of which one end is fixed to the lower side of the moving block 101 and the other end is fixed to the lifting block 104. A pair of limit sensors 122a 122b are provided on the upper center of the vertical block 102, for sensing sensor flags 121a, 121b coupled with the lifting block 104 at the both upper ends thereof. The extension spring 125 provides an elastic force to the lifting block 104 in the opposite direction to the gravity force during the lifting of the lifting block 104 to reduce the weight applied to the servomotor 111.

Therefore, when the driving pulley 112 rotates in the forward direction or backward direction by the operation of the servomotor 111, the driving pulley 112, the transmission pulley 113 connected with the driving pulley 112 by the driving belt 114, and the lower pulley 115 coupled with the transmission pulley rotate, and accordingly, the lifting belt 117 and the upper pulley 116 are interlocked, so that the lifting block 104 connected to the lifting belt 117 by the connecting piece 118 moves up and down.

With the up and down movement of the lifting block 104, the sensor flags 121a, 121b are sensed by the limit sensors 122a, 122b, and the up and down movement amount of the lifting block 104 is transferred to a control unit (not shown) of the handler. The control unit controls the operation of the servomotor according to the signals from the limit sensors 122a, 122b.

However, the conventional picking apparatus structured as above has a problem in that it cannot be used for a tray or a shuttle arranged to have different pitch or number of semiconductor devices in a single handler because it is structured to pick up or detach semiconductor devices by the picker block 105 having the nozzle pickers 105a arranged at a constant pitch.

For example, a user tray for accommodating semiconductor devices for test, or a customer tray for again accommodating semiconductor devices for output, which are classified as good quality through a test, may be designed to have different pitch between devices in one array or the different number of devices from each other, but any test using the conventional picking apparatus essentially requires that the pitch between devices in one array, or the number of devices in the user tray and the customer tray be always constant.

Additionally, the conventional picking apparatus is constructed such that the weight on the servomotor 111 is reduced by the extension spring 125 while the lifting block 104 and the picker block 105 are raised up, but the extension spring 125 functions as a resistance while the lifting block 104 and the picker block 105 move down to increase the driving force of the servomotor 111.

Moreover, it sometimes occurs that the servomotor 111 temporarily stops and the extension spring 125 is fractured or damaged in some or other reasons while semiconductor devices are picked up by the picker block 105, and in that case, normally, the lifting block 104 moves down by its weight. At this time, if the moving block 101 of the picking apparatus moves in the horizontal direction at the above state, the semiconductor devices picked by the picker block 105 are struck by a part of the handler body and fractured.

SUMMARY OF THE INVENTION

Accordingly, the present invention is directed to a picking apparatus for transferring semiconductor devices in a handler that substantially obviates one or more problems due to limitations and disadvantages of the related art.

An object of the present invention is to provide a picking apparatus for transferring semiconductor devices in a handler in which some pairs of pickers for picking up semiconductor devices are provided in a single picking apparatus, the pickers move in the opposite directions from each other to increase the number of the devices to be transferred at one time, and the semiconductor devices in an array of different pitch are transferred at one time.

Another object of the present invention is to provide a picking apparatus for transferring semiconductor devices in a handler in which the semiconductor devices are easily picked up and transferred without burden on the driving elements and the structural elements during the lifting movement of the picker.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a picking apparatus for transferring semiconductor devices in a test handler. The apparatus is horizontally movably installed on a frame provided on an upper side of a main body of the handler, for picking up the devices from one location of the handler and transferring the devices to another location. The apparatus includes: a moving block movably mounted on the frame; a first vertical block and a second vertical block mounted on both sides of the moving block in a vertical direction to face each other; at least one pair of first guide members and at least one pair of second guide members installed respectively in the first vertical block and the second vertical block in the vertical direction; a first lifting block and a second lifting block respectively coupled to the first guide members and the second guide members at both ends thereof to move up and down; a first picker block and a second picker block having a plurality of pickers for picking and detaching the semiconductor devices, and detachably coupled with the first lifting block and the second lifting block; and driving means for driving the first picker block and the second picker block to move up and down in the opposite directions to each other.

In another aspect of the present invention, the driving means include: a servomotor fixedly installed on one side of the moving block; a driving pulley rotatably coupled with a driving axis of the servomotor; a transmission pulley rotatably installed on the upper side of the first vertical block; a driving belt installed to be wound around the driving pulley and the transmission pulley, for transmitting rotation force of the driving pulley to the transmission pulley; a first upper pulley coupled with one side of the driving pulley to rotate with the driving pulley; a first lower pulley rotatably installed on the lower side of the first vertical block; a first lifting belt being wound around the first upper pulley and a second lower pulley; a connecting shaft fixed to the first upper pulley at one end and located on the upper side of the second vertical block at the other end; a second upper pulley fixed to the other end of the connecting shaft; a second lower pulley rotatably coupled with the lower side of the second vertical block; a second lifting belt wound around the second upper pulley and the second lower pulley; and a first connecting member and a second connecting member, one end of each member being fixed on the first lifting block and the second lifting block, and the other end of each member being fixed on one side of each of the first lifting belt and the second lifting belt.

According to the present invention, since the picking apparatus is constructed such that two picker blocks in one picking apparatus move up and down in the opposite directions to each other, the number of the semiconductor devices transferred at one time is increased to enhance a test speed, and the transfer of semiconductor devices in array of different pitch and number is possible to allow users more choices in the selection of a tray and a shuttle for testing semiconductor devices and to improve the operation efficiency.

Additionally, since the loads of the lifting block and the picker block, which move up, are compensated by the loads of the lifting block and the picker block, which move down, the burden applied on the servomotor is reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, one embodiment of a picking apparatus for transferring semiconductor devices in a handler according to the present invention is described with reference to the accompanying drawings.

As shown in FIGS. 4 to 7, a moving block 1 of the picking apparatus for transferring semiconductor devices is mounted on a frame (not shown) to be movable along the frame. The frame is horizontally mounted on a body of the handler. A first vertical block 2 and a second vertical block 3 are vertically installed on the both sides of the moving block 1 to face each other. A pair of first guide members 4 and a pair of second guide members 5, such as an LM Guide are vertically installed in the first vertical block 2 and the second vertical block 3 respectively. Preferably, the first guide members 4 are at least one pair and the second guide members 5 are at least one pair.

A first lifting block 6 is constructed to be coupled with the pair of first guide members 4 at both ends thereof and a second lifting block 7 are constructed to be coupled with the second guide member 5 at both ends thereof. The first lifting block 6 and the second lifting block 7 move up and down together pith the first and second guide members 4 and 5. A first picker block 8 and a second picker block 9 are fixedly coupled to the lower sides of the first lifting block 6 and the second lifting block 7, and the first picker block 8 and the second picker block 9 have a plurality of nozzle pickers 8a, 9a for picking and detaching semiconductor devices.

The first and the second picker blocks 8, 9 are coupled with the first and the second lifting blocks 6, 7 by a coupling means such as a screw (not shown), and they can be easily detached from the first and the second lifting blocks 6, 7 by decoupling the coupling means.

A motor block 11 provided with a servomotor 12 is fixed at one side of the moving block 1, and a driving pulley 13 is coupled to a driving shaft of the servomotor 12.

A transmission pulley 14 is rotatably installed at the upper side of the first vertical block 2, and a driving belt 15 is wound around the driving pulley 13 and the transmission pulley 14 to transmit the rotational force of the driving pulley 13 to the transmission pulley 14.

A first upper pulley 16 is provided at an inner side of the transmission pulley 14 to be coupled with and rotate together with the transmission pulley 14. A first lower pulley 17 is rotatably installed at the lower side of the vertical block 2. The first upper pulley 16 and the first lower pulley 17 are connected with each other by a first lifting belt 18.

A connecting shift 19 is fixed to the first upper pulley 16 at its one end with being crossed over the upper side of the first and the second vertical blocks 2, 3, and a second upper pulley 20 is fixed to the other end of the connecting shaft 19. The second upper pulley 20 is located at the upper side of the second vertical block 3.

A second lower pulley 21 is rotatably installed at the lower side of the second vertical block 3, and a second lifting belt 22 is wound around the second upper pulley 20 and the second lower pulley 21.

Accordingly, if the servomotor 12 starts to operate, the rotational force of the driving pulley 13 is transmitted to the transmission pulley 14 through the driving belt 15, and then, the first upper pulley 16 and the second upper pulley 20 connected with the first upper pulley 16 by the connecting shaft 19, are rotated, and accordingly, the first lifting belt 18 and the second lifting belt 22 move up and down.

A pair of first connecting members 23 are installed, of which one ends are coupled with both sides of the first lifting block 6, and a pair of second connecting members 24 are installed, of which one ends are coupled with both sides of the second lifting block 7. The other ends of the first connecting members 23 and the second connecting members 24 are coupled with the first lifting belt 18 and the second lifting belt 29 at selected locations of the first and second belts 18 and 22. Here, the first connecting members 23 and the second connecting members 24 are respectively coupled at the runs moving in the opposite directions in each of the first and the second belts 18, 22.

Hence, if the first lifting block 6 connected to the first lifting belt 18 by the first connecting member 23 rises, the second lifting block 7 comes down in the opposite direction to the movement of the first lifting block 6. On the contrary, if the first lifting block 6 moves down, the second lifting block 7 moves up.

In the meantime, at an outer side of the second vertical block 3, there are provided a plurality of approach sensors 31, 32, 33, 34 for detecting the locations of the first and the second picker blocks 9 by sensing the lifting location of the second connecting member 24 in up and down directions.

The picking apparatus of semiconductor devices of the present invention constructed as above operates as follows.

When the moving block 1 of the picking apparatus moves along the frame (not shown) on the body of, the handler, and stops at the location to pick semiconductor devices, the servomotor 12 operates to rotate the driving pulley 13 and the transmission pulley 14, and accordingly, the first upper pulley 16, the first lower pulley 17, the second upper pulley 20, and the second lower pulley 21 are rotated to thereby drive the first lifting belt 18 and the second lifting belt 22.

Once the first lifting block 6 moves down by the operation of the first lifting belt 18 and the second lifting belt 22, the second lifting block 7 rises. If the nozzle pickers 8a of the moved-down first picker block 8 adsorb semiconductor devices, the servomotor 12 operates inversely to rotate the transmission pulley 14 inversely, and accordingly, the first lifting block 6 rises and the second lifting block 7 moves down.

During the above operation, if the second connecting member 24 connected to the second lifting block 7, is detected by the second approach sensor 32, i.e., the middle one among the approach sensors 31, 32, 33, 34, the first picker block 8 and the second picker block 9 are detected to be roughly located in the same middle locations, and thereby the servomotor 12 stops its operation and the first and the second lifting blocks 6, 7 are stopped at the location.

Then, the servomotor 12 again operates according to a processing flow to move down the second lifting block 7. The moved-down second lifting block 7 picks up semiconductor devices or mounts the picked-up semiconductor devices on a tray (not shown) or a shuttle (not shown). Or, by moving the moving block 1 to a next processing location, the picking apparatus is moved, too.

In the meantime, when the first lifting block 6 and the second lifting block 7 carry out the lifting works in the opposite directions to each other, if the second connecting member 24 is detected by the first sensor 31, the uppermost one among the approach sensors 31, 32, 33, 34 and the fourth sensor 34, the lowest one among them, which means that the first picker block 8 or the second picker block 9 moves down to the lowest location, the servomotor 12 operates inversely to move up the first lifting block 6 or the second lifting block 7 which is moved down to the lowest location, until the second sensor 32 detects the first picker block 8 or the second picker block 9.

In case a user intends to change the pitch between semiconductor devices and the number of semiconductor devices, which are picked up at one time, the first picker block 8 and the second picker block 9 are selectively separated from the first and the second lifting blocks 6, 7, and then, picker blocks each having a desired pitch between the picking nozzles and a desired number of the picking nozzles are connected to the first and the second lifting blocks 6, 7 respectively.

For example, when loading semiconductor devices to a test site (not shown) with an alignment of 5 array and 10 mm pitch, or when unloading semiconductor devices out of the test site (not shown) with an alignment of 7 array and 8 mm pitch, it is necessary to couple the picker block 8 having 5 array and 10 mm pitch of the nozzle pickers 8a with the firs lifting block 6, and to couple the picker block 9 having 7 array and 8 mm pitch of the nozzle pickers 9a with the second lifting block 7.

In addition, according to the picking apparatus for transferring semiconductor devices of the present invention, since the first lifting block 6 and the second lifting block 7 are operated to move up and down in the opposite directions to each other with coupled with the first lifting belt 18 and the second lifting belt 22, the force in the opposite direction to the gravity force applied on the lifting block, which is raised up, is compensated by the other lifting block, which is moving down. Accordingly, the load on the servomotor 12 is always maintained uniformly, so that the vibration generated during the lifting operation can be remarkably reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A picking apparatus for transferring semiconductor devices in a test handler, the apparatus being horizontally movably installed on a frame provided on an upper side of a main body of the handler, for picking up the devices from one location of the handler and transferring the devices to another location, the apparatus comprising:

a moving block movably mounted on the frame;

a first vertical block and a second vertical block mounted on both sides of the moving block in a vertical direction to face each other;

at least one pair of first guide members and at least one pair of second guide members installed respectively in the first vertical block and the second vertical block in the vertical direction;

a first lifting block and a second lifting block respectively coupled to the first guide members and the second guide members at both ends thereof to move up and down;

a first picker block and a second picker block having a plurality of pickers for picking and detaching the semiconductor devices, and detachably coupled with the first lifting block and the second lifting block; and driving means for driving the first picker block and the second picker block to move up and down in opposite directions to each other.

2. The picking apparatus of claim 1, wherein the driving means comprises:

a motor fixedly installed on one side of the moving block;

a driving pulley rotatably coupled with a driving axis of the motor;

a transmission pulley rotatably installed on the upper side of the first vertical block;

a driving belt installed to be wound around the driving pulley and the transmission pulley, for transmitting rotation force of the driving pulley to the transmission pulley;

a first upper pulley coupled with one side of the driving pulley to rotate with the driving pulley;

a first lower pulley rotatably installed on the lower side of the first vertical block;

a first lifting belt being wound around the first upper pulley and a second lower pulley;

a connecting shaft fixed to the first upper pulley at one end and located on the upper side of the second vertical block at the other end;

a second upper pulley fixed to the other end of the connecting shaft;

a second lower pulley rotatably coupled with the lower side of the second vertical block;

a second lifting belt wound around the second upper pulley and the second lower pulley; and a first connecting member and a second connecting member, one end of each member being fixed on the first lifting block and the second lifting block, and the other end of each member being fixed on one side of each of the first lifting belt and the second lifting belt.

3. The picking apparatus of claim 1, wherein the first picker block and the second picker block each comprise pickers that are different in the pitch and the number.

4. The picking apparatus of claim 2, wherein the first picker block and the second picker block each comprise pickers that are different in the pitch and the number.

5. The picking apparatus of claim 1, further comprising a plurality of sensors installed on either the first vertical block or the second vertical block for detecting a lifting location of the first vertical block and the second vertical block.

6. The picking apparatus of claim 2, further comprising a plurality of sensors installed on either one of the first vertical block and the second vertical block for detecting a lifting location of the first vertical block and the second vertical block.

7. The picking apparatus of claim 5, wherein the sensor is an approach sensor for sensing an approach of the first and second lifting blocks if a part of the first and the second lifting blocks approaches the sensor.

8. The picking apparatus of claim 6, wherein the sensor is a proximity sensor for sensing an approach of the first and second lifting blocks if a part of the first and the second lifting blocks approaches the sensor.

* * * * *